United States Patent [19]
George

[11] 4,386,371
[45] May 31, 1983

[54] WIRED REMOTE CONTROL APPARATUS FOR A TELEVISION RECEIVER

[75] Inventor: John B. George, Indianapolis, Ind.

[73] Assignee: RCA Corporation, New York, N.Y.

[21] Appl. No.: 287,561

[22] Filed: Jul. 28, 1981

[51] Int. Cl.$^3$ .................. H04N 5/44; H04N 5/60
[52] U.S. Cl. ........................ 358/194.1; 250/551;
340/539; 340/825.72; 358/198; 455/231;
455/352; 455/602
[58] Field of Search ............... 358/194.1, 198, 190,
358/165; 455/230, 231, 232, 233, 352-353, 354,
355, 602; 340/162, 694, 695, 531, 539; 250/551;
179/170 J

[56] References Cited

U.S. PATENT DOCUMENTS

| 2,679,001 | 5/1954 | Tomcik | 250/20 |
|---|---|---|---|
| 3,768,019 | 10/1973 | Podowski | 455/353 |
| 3,798,600 | 3/1974 | Saikaishi et al. | 340/148 |
| 3,978,388 | 8/1976 | de Vries | 321/10 |
| 3,984,705 | 10/1976 | George | 310/8.1 |
| 4,024,577 | 5/1977 | Diethelm | 358/190 |
| 4,067,000 | 1/1978 | Carlson | 340/171 R |
| 4,079,418 | 3/1978 | Kupka et al. | 358/194.1 X |
| 4,169,226 | 9/1979 | Fukuji | 250/199 |
| 4,180,804 | 12/1979 | Watanabe et al. | 340/310 R |
| 4,186,346 | 1/1980 | Wysocki | 325/144 |
| 4,211,998 | 7/1980 | Junginger et al. | 340/171 R |
| 4,229,765 | 10/1980 | Sanger | 358/188 |
| 4,264,982 | 4/1981 | Sakarya | 358/194.1 X |
| 4,281,299 | 7/1981 | Newbold | 333/187 |

FOREIGN PATENT DOCUMENTS 53-143121  12/1978  Japan ........................ 358/194.1

OTHER PUBLICATIONS

AN 951-1, Applications for Low Input Current, High Gain Optically-Coupled Isolators, Hewlett-Packard Components, Mar. 1974.
RCA Television Service Data, Hotel/Motel/Hospital Series, File 1978, C1-4, 1978.
Olschewski, B., "Unique Transformer Design Shrinks Hybrid Isolation Amplifier's Size and Cost", *Electronics*, Jul. 20, 1978, pp. 105-112.
Application Note AN80-1, "MOSPOWER FETs—A Key to the Advancement of SMPS Technology", Siliconix Inc., *MOSPOWER FET Design Catalog*, Mar. 1982, pp. 6-25 to 6-32, (Reprinted from Powerconversion International, Mar./Apr. 1980).

Primary Examiner—Robert L. Richardson
Attorney, Agent, or Firm—E. M. Whitacre; P. J. Rasmussen; C. A. Berard, Jr.

[57] ABSTRACT

In a wired remote control for use with a television receiver, audio signals are coupled to a loudspeaker by a transformer providing electrical isolation. The remote control device comprises an oscillator applying a signal at a frequency above the audio range to the transformer and a rectifier at the transformer secondary converting the oscillator signal to a DC signal. That DC signal is selectively applied by a switch to an optocoupler which couples to a control device for controlling the audio source. A filter blocks the oscillator signal from the speaker. Additionally, the control device controls TV channel selection.

10 Claims, 1 Drawing Figure

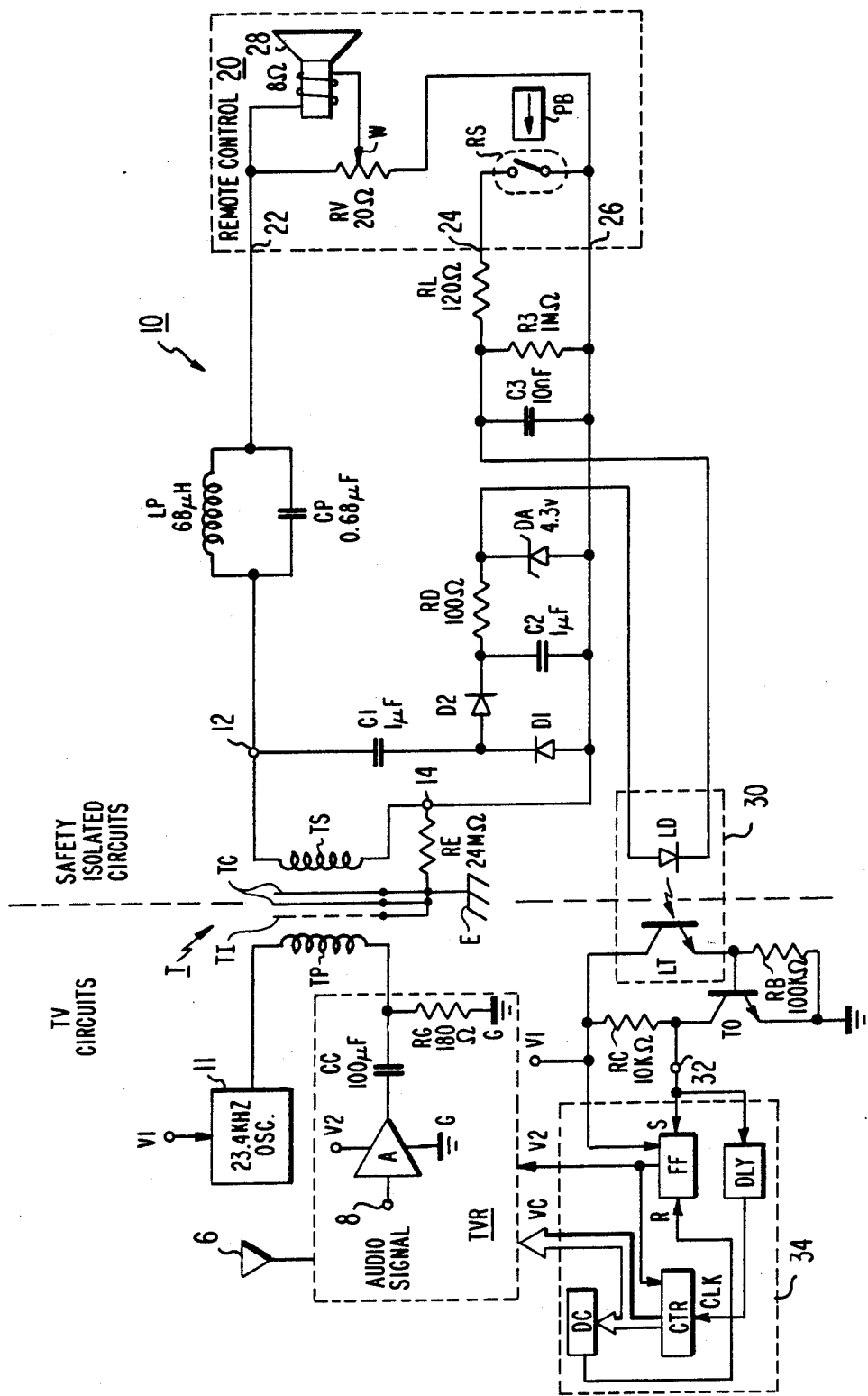

WIRED REMOTE CONTROL APPARATUS FOR A TELEVISION RECEIVER

The present invention relates to apparatus for remotely controlling a television receiver, and, in particular, to an apparatus connected to the television receiver by wire.

In television (TV) receivers for use in a home setting, it is common to employ a remote control apparatus coupled to the TV receiver by light or ultrasonic transmission. In hospital or hotel/motel settings, home-type remote controls can easily become lost or misplaced. Moreover, in a hospital where ultrasonic devices are utilized for cleaning, diagnostic and treatment purposes, those devices could interfere with, and could be interfered with by, the TV remote control. When such remote controls are battery operated, "dead" batteries can be an annoying problem to the TV viewer and to maintenance personnel.

Accordingly, a remote control apparatus which connects to the TV receiver by wire can be employed. This is particularly advantageous when used with a remote loudspeaker so that hospital patients in nearby beds or motel occupants in adjacent rooms are not disturbed by the audio portion of a TV program. Such remote control apparatus is electrically isolated from the TV receiver to increase viewer safety by reducing the possibility of electrical shock.

In the present invention, a source of audio signals is coupled to a loudspeaker by an electrically insulating transformer for reproducing sound from the audio signals. A remote control apparatus for the source comprises an oscillator providing a signal at a frequency other than that of the audio signals to the transformer. A switch selectively couples the oscillator signal to the input circuit of a coupler device, the output circuit of which is electrically insulated from its input circuit. The output circuit couples to a control device which controls the source in response to the oscillator signal.

The sole FIGURE of the drawing is a schematic diagram, partially in block form, of an apparatus embodying the present invention.

Television receiver circuitry TVR receives TV signals from antenna 6 and includes a tuning system, processing circuitry and kinescope necessary to receive, process and display a TV program. An audio signal corresponding to the sound portion of the TV program is applied at terminal 8 to audio amplifier A. Amplifier A receives operating potential V2 and applies the audio signals to primary winding TP of transformer T through DC blocking capacitor CC. Secondary winding TS is coupled via leads 22 and 26 across volume control potentiometer RV so that a portion of the audio signal is applied across loudspeaker 28 from wiper arm W of potentiometer RV in remote control 20 for reproducing the sound portion of the TV program.

The TV circuits to the left of the long-dashed line are referenced to ground G from which the circuitry 10 to the right of that line is electrically isolated by transformer T. To prevent electrical shock, there is no electrical path between the safety isolated circuitry 10 and ground G through which potentially hazardous currents can flow. Transformer T is double isolated by the insulation of the wires used in TP and TS and by safety barrier winding TI which is wound between TS and TP and which is connected to earth ground E. The magnetic core TC and the frame of T are also connected to earth ground E. One end of TS at circuit point 14 connects to E through high value resistor RE so that static potentials cannot accumulate in isolated circuitry 10. The arrangement of T promotes safety in that insulation failures result in "safe" shorts to earth ground E and by reducing the winding capacitance between TP and TS through which potentially hazardous leakage currents could otherwise flow. Transformer T provides magnetic coupling of electrical signals between its primary and secondary windings TP and TS while maintaining high insulation resistance and high breakdown voltage therebetween.

The present arrangement is particularly advantageous with respect to safety because only a single transformer is employed. This reduces the number of leakage paths and reduces the number of devices in which failures could occur; its simplicity tends to lead to improved reliability and decreased cost as well.

Remote control of TVR is accomplished as follows. Oscillator 11 generates and applies to one end of winding TP a signal at about 23.4 kilohertz (KHz) which is outside the frequency range of the audio signals. The return path for the oscillator signal is provided in part by resistor RG, which is part of the audio signal source, at the other end of TP, and in part by components included within amplifier A. Oscillator 11 receives operating potential V1 which is present whenever TVR is connected to a source of electrical power, irrespective of whether TVR is turned on or off. Oscillator 11 similarly provides a return path for the audio signals from amplifier A.

Oscillator signals from TS developed between circuit points 12 and 14 are applied to a peak-to-peak detector including capacitors C1 and C2 and diodes D1 and D2. The direct current potential developed across C2 is substantially equal to the peak-to-peak voltage between 12 and 14.

When leads 24 and 26 are connected together through switch RS, resistor RD and RL and light-emitting diode LD in the input circuit of optocoupler 30 are connected in series across the C2 voltage. RD and RL control the direct current flow in LD which causes it to emit light as indicated by the curved arrow. That light travels across an insulating physical gap in optocoupler 30 and impinges upon light sensitive transistor LT to cause it to become conductive. Current flow in LT develops voltage across RB to make output transistor TO conduct current through its collector resistor RC. As a result, the voltage at circuit point 32 changes from V1 to ground G potential. It is noted that optocoupler 30, also referred to as an optically-coupled isolator, provides electrical signal coupling between its input and output circuits while maintaining high insulation resistance and high breakdown voltage therebetween.

Control logic 34 receives operating voltage V1 and develops control signals VC and V2. Assuming that the TVR is off, set-reset flip-flop FF is in its reset state and V2 and VC are both absent. The first closure of switch RS generates a first negative-going change of the voltage at point 32 from V1 to ground G potential which is applied to set input S of FF to transfer it to its set state. The setting of FF causes voltage V2 to be developed and applied as operating voltage to digital counter CTR and to the TVR including its audio signal source. CTR responds to application of V2 by resetting itself to all zeros so that no VC signal is developed as yet. The negative change at 32 is delayed by about 40 milliseconds by delay circuit DLY and is then applied to the clock input CLK of CTR to advance it to the first state which develops channel tuning signal VC corresponding to the lowest frequency TV channel (e.g. VHF channel 2) which is applied to the tuning system of the TVR. Digital decoder DC has no output at this time.

At each subsequent closure of RS, the negative voltage change at 32 has no effect on FF (which is already in its set state) but causes CTR to increment to the next highest TV channel count state changing VC to similarly advance the tuner of TVR. After CTR has been advanced to its highest valid count state which generates VC corresponding to the highest frequency TV channel (e.g., UHF channel 83), the next negative voltage change at 32 advances CTR to a count state which is not corresponding to a valid TV channel. That invalid count state is detected by digital decoder DC which applies a resetting signal to reset input R of FF. As a result of FF being reset, V2 is removed and the TVR is turned off by removal of its operating potential V2, thereby completing the control selection sequence.

Control logic 34 can also desirably include a feature providing continuous channel advancing when RS is maintained closed or providing selection of only predetermined channels. With the first feature, CTR receives CLK signals at a predetermined rate (e.g., two pulses per second to advance VC at two channels per second) so long as RS is maintained closed or until the highest channel is passed causing DC to turn the TVR off. With the second feature, a memory is employed to store the predetermined channel count information which is compared to VC. If VC is other than a predetermined count state, additional CLK signals are applied until a predetermined channel is reached. U.S. Pat. Nos. 4,249,089 entitled SHORT-TERM POWER DROPOUT ARRANGEMENT USEFUL IN A TELEVISION RECEIVER and 4,264,977 entitled SEARCH TYPE TUNING SYSTEM are incorporated herein by reference for describing TV tuning systems and control arrangements that can be employed with the present invention.

The single-switch control arrangement described above is well suited to hospital remote control devices because patients having minimal dexterity can successfully manipulate the simple control. It is further advantageous in that its simplicity tends to make it more reliable and less expensive.

When both audio and oscillator signals are applied to transformer T and their sum is developed between points 12 and 14, the voltage across C2 increases to the sum of their peak-to-peak values. Avalanche diode DA limits the maximum voltage across RL and LD and, therefore, the current through LD, under that condition. Resistor RL also limits the maximum current which can flow in switch RS. Capacitor C3 and resistor R3 protect the LD circuit by bypassing electrostatic signals which can be developed on leads 24 or 26.

Oscillator signals at about 23.4 KHz developed between circuit points 12 and 14 are also applied to loudspeaker 28. Loudspeaker 28 is very inefficient at 23.4 KHz so little acoustic output is developed at that ultrasonic frequency. Humans would not be aware of the ultrasonic sound waves because they are beyond the frequency range of the human ear. Those waves could, however, disturb ultrasonic or other equipment in a hospital or cause a hotel guest's dog to bark or howl. To reduce those potentialities, a parallel circuit of inductor LP and capacitor CP is connected in series with the speaker to substantially reduce the level of oscillator signal applied to loudspeaker 28. The parallel circuit resonates at about 23.4 KHz.

Modifications to the present invention are contemplated, and the invention should be limited only by the claims following. For example, oscillator signal from TS could be applied to LD through RL and RS without first developing direct current voltage across C2 where the oscillator signal amplitude is large as compared to that of the audio signal.

Switch RS is illustrated as a reed switch enclosed in a sealed chamber (indicated by the dashed oval) and activated by a magnet included in push button PB. That is desirable so as to not generate exposed arcs in a hospital room where oxygen is being used. A mechanical switch is equally satisfactory for RS such as for use in a hotel/motel setting. Moreover, loudspeaker 28 can be located in the TV receiver or built in to a room instead of being included in remote control 20. In that case, volume control RV would be connected at one end to lead 26 and at wiper arm W to lead 22, and loudspeaker 28 would be connected in series with the LP-CP circuit between circuit point 12 and lead 22.

Although the LP-CP circuit could include a variable capacitor or a variable inductor for tuning it to the frequency of oscillator 11, it is preferred that fixed valued capacitors and inductors be employed and that the frequency of oscillator 11 be adjusted to the resonant frequency of the LP-CP circuit. An adjustment range of ±2 KHz has been found satisfactory.

What is claimed is:

1. In an apparatus for reproducing sound at an isolated loudspeaker including:
   a transformer having a first winding and having a second winding magnetically coupled to said first winding but electrically insulated therefrom,
   a source of audio signals and means for coupling said audio signals to said first winding, and
   a loudspeaker to which said second winding is coupled for reproducing sound in response to said audio signals;
   apparatus for remotely controlling said source comprising:
   an oscillator for providing, at least at times when said audio signals are not present, an oscillator signal at a frequency other than that of said audio signals;
   means for coupling said oscillator signal to said first winding;
   coupling means having an input circuit and having an output circuit coupled to its input circuit for responding to electrical signals applied thereto, wherein said output circuit is electrically insulated from said input circuit;
   a switch for selectively coupling said audio signals and said oscillator signals present at said second winding to the input circuit of said coupling means; and
   control means to which the output circuit of said coupling means is coupled for controlling said source in response to said audio signals and said oscillator signals present.

2. The apparatus of claim 1 wherein said remote control apparatus further comprises:
   rectifying means coupled in circuit with said second winding, said switch and said input circuit for developing a substantially direct current signal from said oscillator signal, which direct current signal is selectively applied to said input circuit by said switch.

3. The apparatus of claim 2 wherein said rectifying means includes voltage limiting means for limiting the magnitude of said direct current signal.

4. The apparatus of claim 2 further including a resistance connected in series with said switch and said input circuit for controlling the current therethrough.

5. The apparatus of claim 1 further comprising means interposed between said second winding and said loudspeaker for substantially reducing application of said oscillator signal to said loudspeaker.

6. The apparatus of claim 5 wherein said means for substantially reducing includes an inductance and a capacitance having respective values selected to resonate at about the frequency of said oscillator signal.

7. The apparatus of claim 6 wherein said inductance and said capacitance are in parallel circuit connection, and said parallel circuit is serially connected with said loudspeaker.

8. The apparatus of claim 1 wherein said source is included within a television receiver receiving a plurality of television channels, said control means developing a first control signal for activating said source and developing a second control signal for selecting ones of said television channels.

9. The apparatus of claim 1 wherein the input circuit of said coupling means includes a light emitting diode and the output circuit thereof includes a light sensitive transistor to which said light emitting diode is optically coupled.

10. The apparatus of claim 1 wherein said source connects to a first end of said first winding and provides a return path for said oscillator signals thereat, and said oscillator connects to the other end of said first winding and provides a return path for said audio signals thereat.

* * * * *